United States Patent
Kannappan et al.

(10) Patent No.: US 9,706,287 B2
(45) Date of Patent: Jul. 11, 2017

(54) SIDETONE-BASED LOUDNESS CONTROL FOR GROUPS OF HEADSET USERS

(71) Applicant: Plantronics, Inc., Santa Cruz, CA (US)

(72) Inventors: Ken Kannappan, Palo Alto, CA (US); Douglas K Rosener, Santa Cruz, CA (US)

(73) Assignee: Plantronics, Inc., Santa Cruz, CA (US)

( * ) Notice: Subject to any disclaimer, the term of this patent is extended or adjusted under 35 U.S.C. 154(b) by 0 days.

(21) Appl. No.: 14/926,462

(22) Filed: Oct. 29, 2015

(65) Prior Publication Data

US 2017/0127170 A1    May 4, 2017

(51) Int. Cl.
*H03G 3/20* (2006.01)
*H04R 1/10* (2006.01)
*H03G 3/32* (2006.01)

(52) U.S. Cl.
CPC ............. *H04R 1/1083* (2013.01); *H03G 3/32* (2013.01); *H04R 2430/01* (2013.01)

(58) Field of Classification Search
CPC ..... H04R 2430/01; H04R 1/1083; H03G 3/32
See application file for complete search history.

(56) References Cited

U.S. PATENT DOCUMENTS

| | | | |
|---|---|---|---|
| 6,850,617 B1 | 2/2005 | Weigand | |
| 7,003,096 B2 | 2/2006 | Lashley et al. | |
| 7,881,927 B1 | 2/2011 | Reuss | |
| 8,504,115 B2 | 8/2013 | Junge et al. | |
| 2002/0037746 A1* | 3/2002 | Osano | H04M 1/585 455/557 |
| 2002/0090078 A1 | 7/2002 | Feltstrom et al. | |
| 2004/0174989 A1 | 9/2004 | Michaelis | |
| 2004/0242160 A1* | 12/2004 | Ichikawa | H04M 1/585 455/67.13 |
| 2010/0022280 A1* | 1/2010 | Schrage | H04M 1/58 455/567 |
| 2014/0072135 A1* | 3/2014 | Bajic | G10K 11/1784 381/71.11 |
| 2015/0334489 A1* | 11/2015 | Iyengar | H04R 3/04 381/71.6 |

* cited by examiner

*Primary Examiner* — Muhammad N Edun

(57) ABSTRACT

Methods and computer-readable media embodying instructions executable by a computer to perform functions comprise: obtaining one or more indications of a sound level produced by a group of users of audio communication devices; and adjusting sidetone gains of the audio communication devices based on the one or more indications of the sound level produced by the group of users.

14 Claims, 5 Drawing Sheets

SIDETONE-BASED LOUDNESS CONTROL FOR GROUPS OF HEADSET USERS

FIELD

The present disclosure relates generally to the field of communications headsets. More particularly, the present disclosure relates to controlling sidetone generated by the headsets.

BACKGROUND

In crowded office spaces or call centers, people speaking loudly on telephones or communications headsets can disturb others. This is a common problem when shared space is at a premium. Furthermore, under noisy conditions users will intuitively speak louder even if it is not necessary to do so. As a result of this positive feedback the overall noise level rises. The most common solution involves telling other people directly that they are talking too loudly on the phone. But this direct feedback can cause ill will between the person who is talking loudly and the person providing the feedback.

SUMMARY

In general, in one aspect, an embodiment features computer-readable media embodying instructions executable by a computer to perform functions comprising: obtaining one or more indications of a sound level produced by a group of users of audio communication devices; and adjusting sidetone gains of the audio communication devices based on the one or more indications of the sound level produced by the group of users.

Embodiments of the computer-readable media may include one or more of the following features. In some embodiments, the adjusting the sidetone gains of the audio communication devices comprises: decreasing the sidetone gains of the audio communication devices responsive to the one or more indications of the sound level being above a threshold; and increasing the sidetone gains of the audio communication devices responsive to the one or more indications of the sound level being below the threshold. In some embodiments, the one or more indications indicate whether one or more of the users has indicated that the group of users is talking too loudly. In some embodiments, one or more of the indications of the sound level represent outputs of one or more microphones; and the adjusting comprises comparing the indications with a threshold. In some embodiments, one or more of the indications of the sound level represent output of a microphone worn by one of the users; and the adjusting comprises comparing the indications with a threshold. In some embodiments, one or more of the indications of the sound level represent output of a microphone of a headset worn by one of the users; and the adjusting comprises comparing the indications with a threshold. In some embodiments, at least one of the audio communication devices comprises a headset.

In general, in one aspect, an embodiment features a method comprising: obtaining one or more indications of a sound level produced by a group of users of audio communication devices; and adjusting sidetone gains of the audio communication devices based on the one or more indications of the sound level produced by the group of users.

Embodiments of the method may include one or more of the following features. In some embodiments, the adjusting the sidetone gains of the audio communication devices comprises: decreasing the sidetone gains of the audio communication devices responsive to the one or more indications of the sound level being above a threshold; and increasing the sidetone gains of the audio communication devices responsive to the one or more indications of the sound level being below the threshold. In some embodiments, the one or more indications indicate whether one or more of the users has indicated that the group of users is talking too loudly. In some embodiments, one or more of the indications of the sound level represent outputs of one or more microphones; and the adjusting comprises comparing the indications with a threshold. In some embodiments, one or more of the indications of the sound level represent output of a microphone worn by one of the users; and the adjusting comprises comparing the indications with a threshold. In some embodiments, one or more of the indications of the sound level represent output of a microphone of a headset worn by one of the users; and the adjusting comprises comparing the indications with a threshold. In some embodiments, at least one of the audio communication devices comprises a headset.

The details of one or more implementations are set forth in the accompanying drawings and the description below. Other features will be apparent from the description and drawings, and from the claims.

Figure 1:
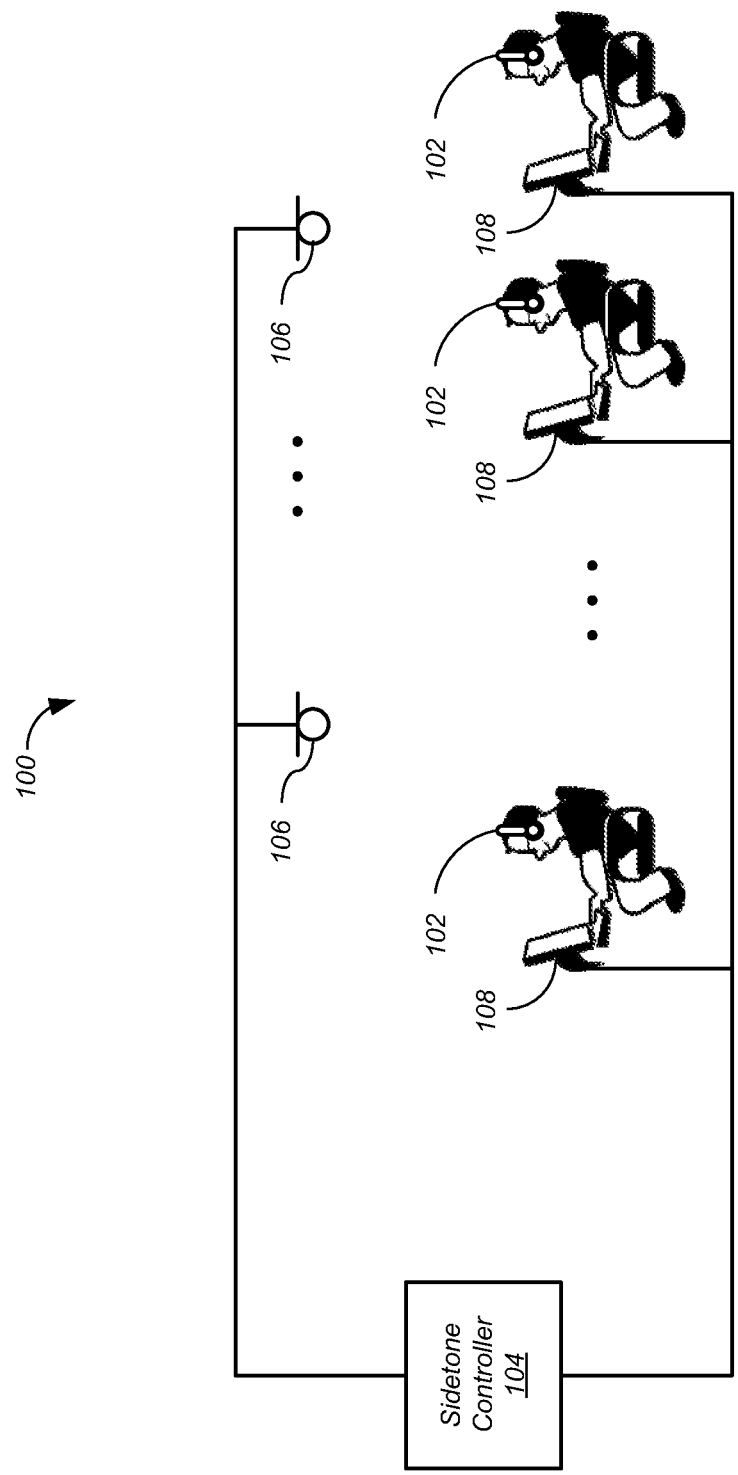
FIG. 1 shows elements of a sidetone control system according to one embodiment.

The leading digit(s) of each reference numeral used in this specification indicates the number of the drawing in which the reference numeral first appears.

DETAILED DESCRIPTION

Sidetone is a type of audio feedback employed by audio communication devices such as telephones and headsets. Sidetone is produced when sound received by the microphone, preferably the user's voice, is fed back to the user by the earpiece speaker. It is well-known that adjusting the volume of the sidetone provides negative feedback to the user, causing the user to raise or lower his voice. When people hear themselves at an elevated level, they intuitively talk quieter. Conversely, if there is little or no feedback, they tend to talk louder.

The amplification or attenuation of the feedback is controlled by setting the sidetone gain. Often sidetone gain is fixed in the hardware of the headset or telephone. But in some devices such as softphones, the sidetone gain can be set by the user, by information technology personnel, and the like.

Crowd sourcing is a known method of sampling data or input from a group in a specified or general location and using that data to make decisions. The sampling can be done automatically with sensors, or it can be put as a verbal or written request to people at the location of interest.

Embodiments of the present disclosure employ crowd sourcing and sidetone to provide loudness control for groups of users of audio communication devices such as headsets, smartphones, desk phones, and the like. Crowd sourcing may be employed to collect one or more indications of the sound level produced by a group of such users. The sidetone gain of the audio communication devices may then be adjusted based on the indication(s) of that sound level.

While various embodiments are discussed in terms of headsets, the techniques described herein are applicable to other sorts of audio communication devices. For example the techniques apply to telephones, smartphones, feature phones, softphones, and the like.

FIG. 1 shows elements of a sidetone control system 100 according to one embodiment. Although in the described embodiment elements of the sidetone control system 100 are presented in one arrangement, other embodiments may feature other arrangements. For example, elements of the sidetone control system 100 may be implemented in hardware, software, or combinations thereof.

Referring to FIG. 1, in the sidetone control system 100 each user wears a headset 102. The headset 102 may be any headset. For example, the headsets 102 may be wired, wireless, monaural, binaural, and so on. The headsets 102 may be all the same or different from each other. In FIG. 1, each headset 102 is in communication with a respective computer 108. For example, the headsets 102 may be in communication with softphone applications executing on the computers 108. In other embodiments, the computers 108 may be replaced by desk phones, smartphones, feature phones, and the like. Each headset 102 is in communication with a sidetone controller 104. The sidetone controller 104 may be implemented as a processor or the like. The communication may be direct, via a computer 108, or the like.

In some embodiments, the sidetone control system 100 includes one or more microphones 106. The microphones 106 are in communication with the sidetone controller 104. In some embodiments, the microphone(s) 106 are placed in the workspace of the users, for example overhead as shown in FIG. 1. In some embodiments, the microphones 106 are worn by the users, for example in wearable devices. The wearable devices may include the headsets 102. In other embodiments no microphones are used in sidetone control. In some embodiments, the microphones 106 may be implemented as simple sound meters that produce only an indication of a sound level. In some embodiments, the microphones 106 may produce an audio signal that is then processed by the sidetone controller 104 to obtain an indication of a sound level. Combinations of these implementations may be employed.

Figure 2:
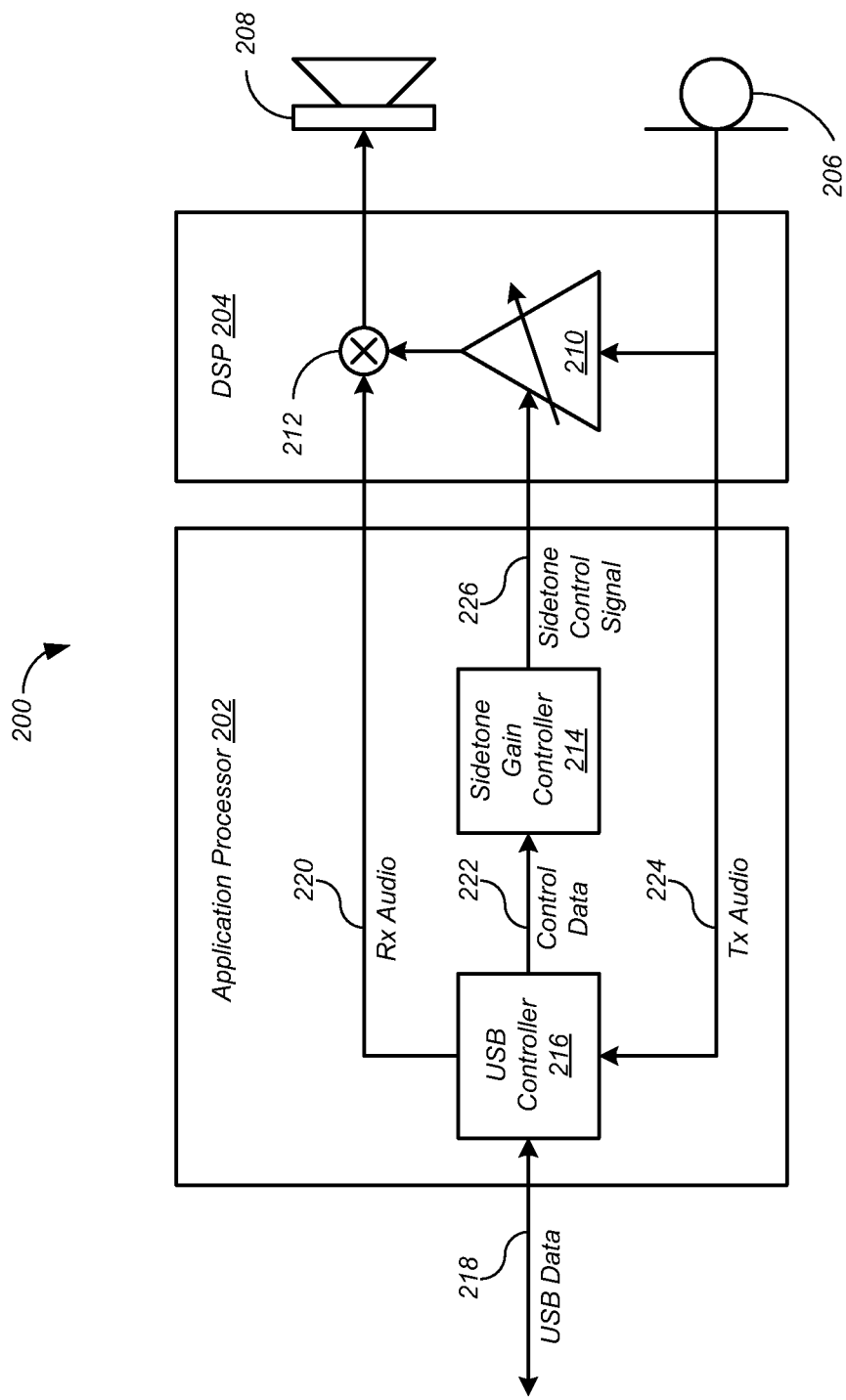
FIG. 2 shows elements of a headset according to one embodiment.

FIG. 2 shows elements of a headset 200 according to one embodiment. Although in the described embodiment elements of the headset 200 are presented in one arrangement, other embodiments may feature other arrangements. For example, elements of the headset 200 may be implemented in hardware, software, or combinations thereof. The hardware may be implemented as discrete components, as one or more integrated circuits, or any combination thereof. As another example, some of the elements of the headset 200 may be omitted. For example, the receiver and transmitter may not be required in a wired headset. The headset 200 may be used as the headset 102 in the sidetone control system 100 of FIG. 1. In the described embodiment, the headset 200 employs a Universal Serial Bus (USB) connection. However, in other embodiments, the headset may employ other connections including wired and wireless connections.

Referring to FIG. 2, the headset 200 includes an application processor 202, a digital signal processor (DSP) 204, a microphone 206, and a speaker 208. The DSP 204 includes a variable-gain amplifier (VGA) 210 and a mixer 212. The application processor 202 includes a sidetone gain controller 214 and a USB controller 216.

In operation, the USB controller 216 of the application processor 202 exchanges USB data 218 with a USB host (not shown). The USB data 218 received by the USB controller 216 includes an inbound audio signal (Rx Audio 220) and control data 222. The USB data 218 transmitted by the USB controller 216 includes an outbound audio signal (Tx Audio 224). The audio signal produced by the microphone 206 (Tx Audio 224) may be amplified or attenuated by the VGA 210, mixed by the mixer 212 with the audio signal received by the receiver 202 (Rx Audio 220), and fed to the speaker 208. The amplification or attenuation applied by the VGA 210 may be controlled by the sidetone gain controller 214 in accordance with control data 222 received by the USB controller 216.

Figure 3:
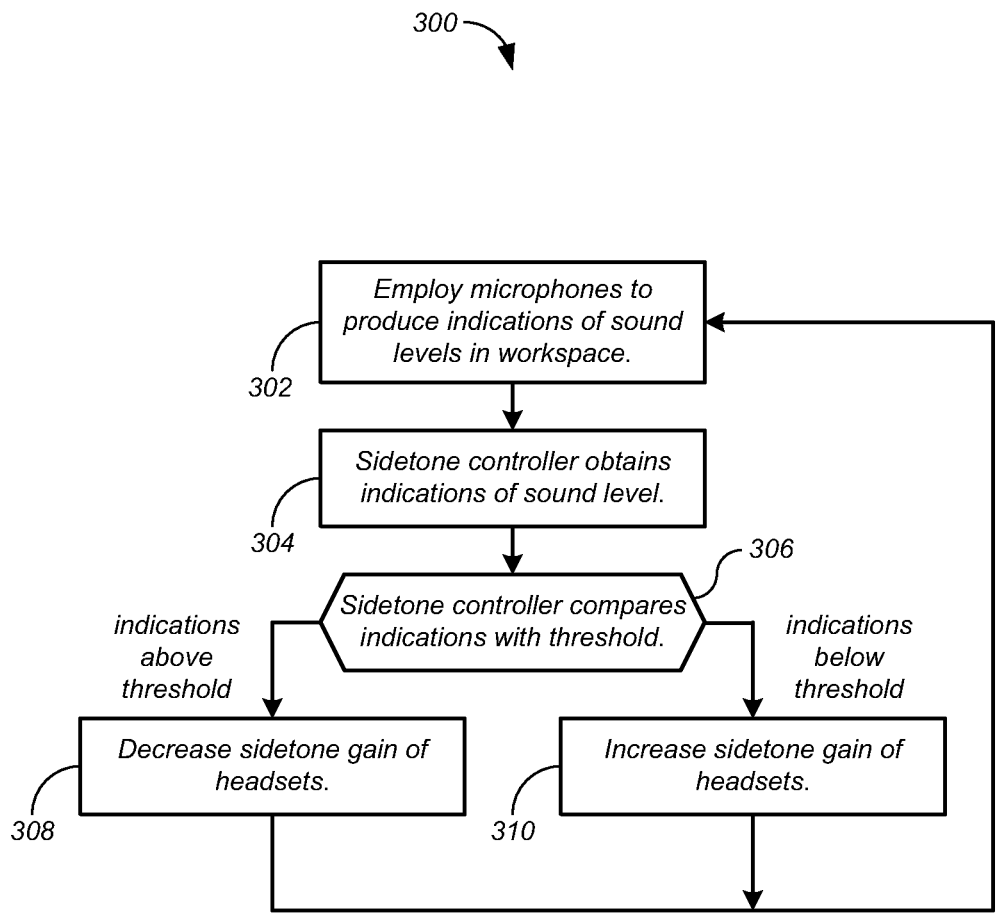
FIG. 3 shows a process for the sidetone control system of FIG. 1 according to an embodiment that employs microphones worn by the headset users or disposed in the ceiling plenum or elsewhere in the workspace.

FIG. 3 shows a process 300 for the sidetone control system 100 of FIG. 1 according to an embodiment that employs microphones 106 worn by the headset users or disposed in the ceiling plenum or elsewhere in the workspace. Although in the described embodiments the elements of process 300 are presented in one arrangement, other embodiments may feature other arrangements. For example, in various embodiments, some or all of the elements of process 300 can be executed in a different order, concurrently, and the like. Also some elements of process 300 may not be performed, and may not be executed immediately after each other. In addition, some or all of the elements of process 300 can be performed automatically, that is, without human intervention.

Referring to FIG. 3, at 302, the microphones 106 are employed to produce indications of sound levels in the workspace. In some embodiments, the microphones 106 may be implemented as simple sound meters that produce these indications directly. In some embodiments, the microphones 106 may produce an audio signal that is then processed by the sidetone controller 104 to obtain these indications. Combinations of these techniques may be employed.

At 304, the sidetone controller 104 may obtain the indications of the sound level produced by the group of headset users. At 306, the sidetone controller 104 may compare the indications with a threshold. For example the sidetone controller 104 may form an average of all received levels and compare that to the threshold. The sidetone controller 104 may adjust the sidetone gains of the headsets 102 based on the comparison. At 308, responsive to the indications of the sound level being above the threshold, the sidetone controller 104 may decrease the sidetone gain of the headsets 102. At 310, responsive to the indications of the sound level being below the threshold, the sidetone controller 104 may increase the sidetone gain of the headsets 102. The sidetone controller 104 may adjust the sidetone gain of the headsets 102 by sending a control signal to the headsets 102. In response to the control signal, the headsets adjust their sidetone gains, for example as described above. At 302, the process 300 may repeat as needed.

Figure 4:
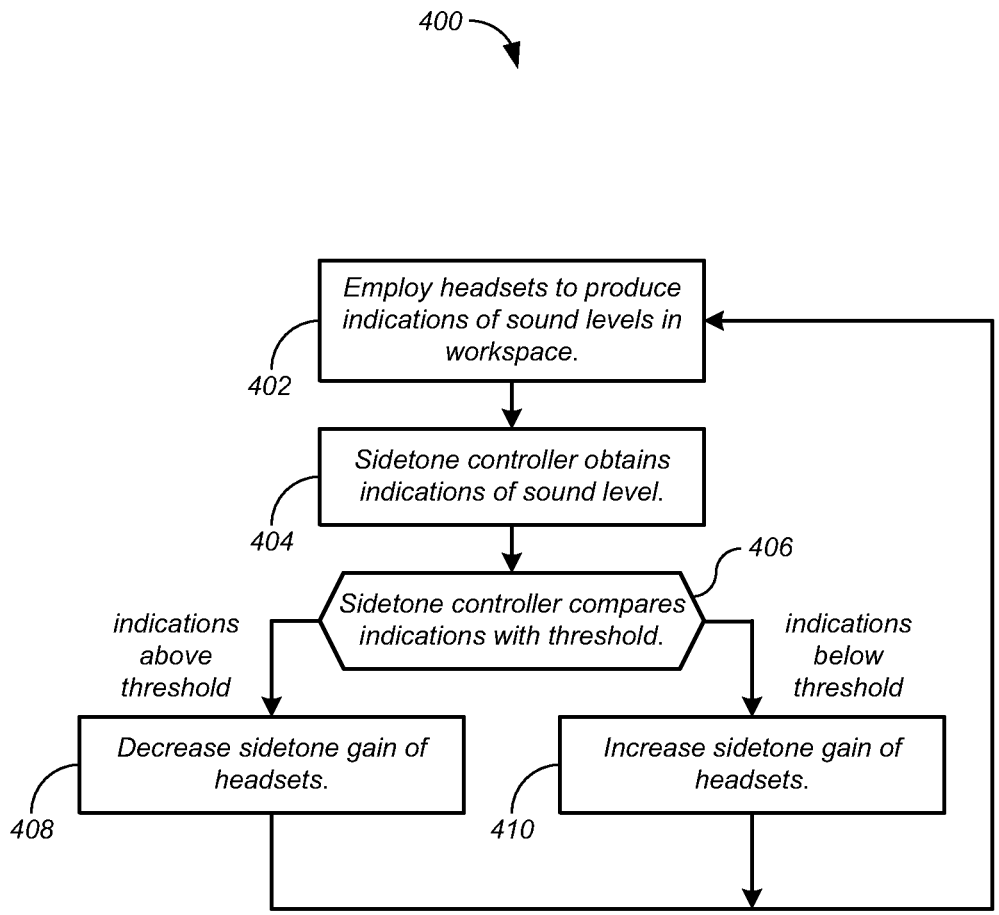
FIG. 4 shows a process for the sidetone control system of FIG. 1 according to an embodiment that employs the microphones of the headsets.

FIG. 4 shows a process 400 for the sidetone control system 100 of FIG. 1 according to an embodiment that employs the microphones 206 of the headsets 200. Although in the described embodiments the elements of process 400 are presented in one arrangement, other embodiments may feature other arrangements. For example, in various embodiments, some or all of the elements of process 400 can be executed in a different order, concurrently, and the like. Also some elements of process 400 may not be performed, and may not be executed immediately after each other. In addition, some or all of the elements of process 400 can be performed automatically, that is, without human intervention.

Referring to FIG. 4, at 402, the microphones 206 may produce an audio signal representing sounds in the workspace. At 404, the sidetone controller 104 may obtain indications of the sound level produced by the group of headset users based on the audio signal produced by the microphones 206. At 406, the sidetone controller 104 may compare the indications with a threshold. For example the sidetone controller 104 may form an average of all received levels and compare that to the threshold. The sidetone controller 104 may adjust the sidetone gains of the headsets 200 based on the comparison. At 408, responsive to the indications of the sound level being above the threshold, the sidetone controller 104 may decrease the sidetone gain of the headsets 200. At 410, responsive to the indications of the sound level being below the threshold, the sidetone controller 104 may increase the sidetone gain of the headsets 200. The sidetone controller 104 may adjust the sidetone gain of the headsets 200 by sending a control signal to the headsets 200. In response to the control signal, the headsets adjust their sidetone gains, for example as described above. At 402, the process 400 may repeat as needed.

In some embodiments, a person such as a call center manager may decide to operate the sidetone controller 104 directly. For example, this person may make this decision based on observing an aggregate noise level on a noise meter or the like. As another example, this person may make this decision subjectively based on direct observation of the sound environment.

Figure 5:
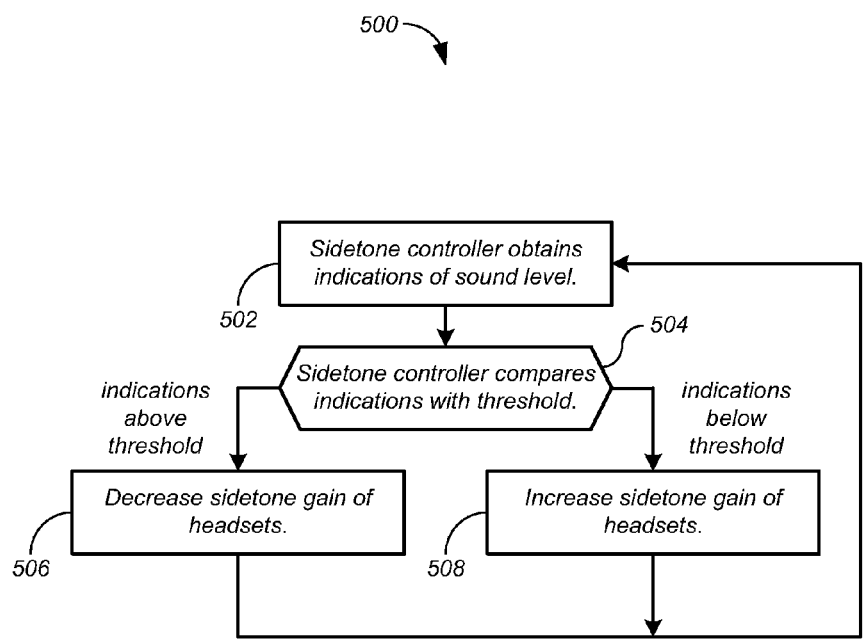
FIG. 5 shows a process for the sidetone control system of FIG. 1 according to an embodiment that employs no microphones.

FIG. 5 shows a process 500 for the sidetone control system 100 of FIG. 1 according to an embodiment that employs no microphones. Although in the described embodiments the elements of process 500 are presented in one arrangement, other embodiments may feature other arrangements. For example, in various embodiments, some or all of the elements of process 500 can be executed in a different order, concurrently, and the like. Also some elements of process 500 may not be performed, and may not be executed immediately after each other. In addition, some or all of the elements of process 500 can be performed automatically, that is, without human intervention.

Referring to FIG. 5, at 502, the sidetone controller 104 may obtain indications of the sound level produced by the group of headset users where each of the indications indicates whether one of the users has indicated that the group of headset users is talking too loudly. For example, the sidetone controller 104 may occasionally send messages to one or more of the headset users asking whether the group of headset users is talking too loudly. The indications may represent the responses to these messages.

At 504, the sidetone controller 104 may compare the indications with a threshold. For example, the sidetone controller 104 may compare the number of positive responses with a voting threshold representing a simple majority. The sidetone controller 104 may adjust the sidetone gains of the headsets 200 based on the comparison. At 506, responsive to the indications of the sound level being above the threshold, the sidetone controller 104 may decrease the sidetone gain of the headsets 200. At 508, responsive to the indications of the sound level being below the threshold, the sidetone controller 104 may increase the sidetone gain of the headsets 200. The sidetone controller 104 may adjust the sidetone gain of the headsets 200 by sending a control signal to the headsets 200. In response to the control signal, the headsets adjust their sidetone gains, for example as described above. At 502, the process 500 may repeat as needed.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits). As used herein, the term "module" may refer to any of the above implementations.

A number of implementations have been described. Nevertheless, various modifications may be made without departing from the scope of the disclosure. Accordingly, other implementations are within the scope of the following claims.

What is claimed is:

1. One or more non-transitory computer-readable storage media having computer-executable instructions stored thereon which, when executed by one or more computers, cause the one more computers to perform operations comprising:
   obtaining one or more indications of a sound level in a space, wherein a plurality of users operating a plurality of communication devices are located within the space; and
   adjusting a sidetone gain of the plurality of communication devices responsive to the one or more indications of the sound level in the space.

2. The one or more non-transitory computer-readable storage media of claim 1, wherein the adjusting the sidetone gain of the plurality of communication devices comprises:

decreasing the sidetone gain of the plurality of communication devices responsive to the one or more indications of the sound level being above a threshold; and increasing the sidetone gain of the plurality of communication devices responsive to the one or more indications of the sound level being below the threshold.

3. The one or more non-transitory computer-readable storage media of claim 1, wherein:

the one or more indications indicate whether a user in the plurality of users has indicated that the plurality of users is talking too loudly.

4. The one or more non-transitory computer-readable storage media of claim 1, wherein:

one or more of the indications of the sound level represent outputs of one or more microphones; and the adjusting comprises comparing the indications with a threshold.

5. The one or more non-transitory computer-readable storage media of claim 1, wherein:

one or more of the indications of the sound level represent output of a microphone worn by one of the users in the plurality of users; and the adjusting comprises comparing the indications with a threshold.

6. The one or more non-transitory computer-readable storage media of claim 1, wherein:

one or more of the indications of the sound level represent output of a microphone of a headset worn by one of the users in the plurality of users; and the adjusting comprises comparing the indications with a threshold.

7. The one or more non-transitory computer-readable storage media of claim 1, wherein:

at least one of the communication devices in the plurality of communication devices comprises a headset.

8. A method comprising:

obtaining one or more indications of a sound level in a space, wherein a plurality of users operating a plurality of communication devices are located within the space; and adjusting a sidetone gain of the plurality of communication devices responsive to the one or more indications of the sound level in the space.

9. The method of claim 8, wherein the adjusting the sidetone gain of the plurality of communication devices comprises:

decreasing the sidetone gain of the plurality of communication devices responsive to the one or more indications of the sound level being above a threshold; and increasing the sidetone gain of the plurality of communication devices responsive to the one or more indications of the sound level being below the threshold.

10. The method of claim 8, wherein:

the one or more indications indicate whether a user in the plurality of users has indicated that the plurality of users is talking too loudly.

11. The method of claim 8, wherein:

one or more of the indications of the sound level represent outputs of one or more microphones; and the adjusting comprises comparing the indications with a threshold.

12. The method of claim 8, wherein:

one or more of the indications of the sound level represent output of a microphone worn by one of the users in the plurality of users; and the adjusting comprises comparing the indications with a threshold.

13. The method of claim 8, wherein:

one or more of the indications of the sound level represent output of a microphone of a headset worn by one of the users in the plurality of users; and the adjusting comprises comparing the indications with a threshold.

14. The method of claim 8, wherein:

at least one of the communication devices in the plurality of communication devices comprises a headset.

* * * * *